(12) United States Patent
Rasmussen

(10) Patent No.: US 7,541,864 B2
(45) Date of Patent: Jun. 2, 2009

(54) POWER AMPLIFIER AND PULSE-WIDTH MODULATED AMPLIFIER

(75) Inventor: Carsten Rasmussen, Frederiksberg (DK)

(73) Assignee: Silicon Power Devices APS, Lyngby (DK)

(*) Notice: Subject to any disclaimer, the term of this patent is extended or adjusted under 35 U.S.C. 154(b) by 8 days.

(21) Appl. No.: 11/569,965

(22) PCT Filed: Jun. 6, 2005

(86) PCT No.: PCT/DK2005/000370

§ 371 (c)(1),
(2), (4) Date: Feb. 19, 2007

(87) PCT Pub. No.: WO2005/119904

PCT Pub. Date: Dec. 15, 2005

(65) Prior Publication Data

US 2008/0001660 A1    Jan. 3, 2008

(51) Int. Cl.
H03G 3/30 (2006.01)
H03G 5/16 (2006.01)

(52) U.S. Cl. .................. 330/10; 330/136; 330/297; 330/127; 455/114.3; 455/127.2; 375/296; 375/308; 375/315

(58) Field of Classification Search .......... 330/136, 330/10, 297, 127; 375/296, 308, 315; 455/114.3, 455/127.2

See application file for complete search history.

(56) References Cited

U.S. PATENT DOCUMENTS

| | | | |
|---|---|---|---|
| 5,352,986 A | 10/1994 | Modgil et al. | |
| 5,479,337 A | 12/1995 | Voigt | |
| 5,675,288 A | 10/1997 | Peyrotte et al. | |
| 5,973,556 A | 10/1999 | Su | |
| 6,043,707 A | 3/2000 | Budnik | |
| 6,414,560 B2 | 7/2002 | Delano | |
| 7,372,918 B2 * | 5/2008 | Muller et al. | 375/296 |
| 2002/0070799 A1 | 6/2002 | Dahan et al. | |
| 2003/0095000 A1 | 5/2003 | Ramage et al. | |
| 2003/0112063 A1 | 6/2003 | Kenington | |
| 2007/0008031 A1 | 1/2007 | Kranz | |

FOREIGN PATENT DOCUMENTS

WO    WO-02/47249    6/2002

OTHER PUBLICATIONS

L. Kahn, "Single-Sides Transmission by Envelope and Restoration," Proceedings of I.R.E., Jul. 1952, pp. 803-806.
M. Koch et al., "A High-Frequency 835 MHZ Linear Power Amplifier for Digital Cellular Telephony," 39. IEEE Vehicular Technology Conference, May 3, 1989.

* cited by examiner

*Primary Examiner*—Michael B Shingleton
(74) *Attorney, Agent, or Firm*—Gifford, Krass, Sprinkle, Anderson & Citkowski. P.C.

(57) ABSTRACT

The invention relates to a power amplifier having a phase amplification path with a phase amplification stage within said phase amplification path. Here the phase amplification stage receives a magnitude component of the power amplified output signal, and the phase amplification stage is responsive to a phase component of the input signal, a magnitude component of the input signal, and the received magnitude component of the power amplified output signal for generating the power amplified output signal. The invention also relates to a power amplifier having a magnitude amplification path for a magnitude component of the input signal with a magnitude amplifier stage within said magnitude amplification path, and with the power amplifier further having a phase amplification path with a phase amplification stage within said phase amplification path.

18 Claims, 10 Drawing Sheets

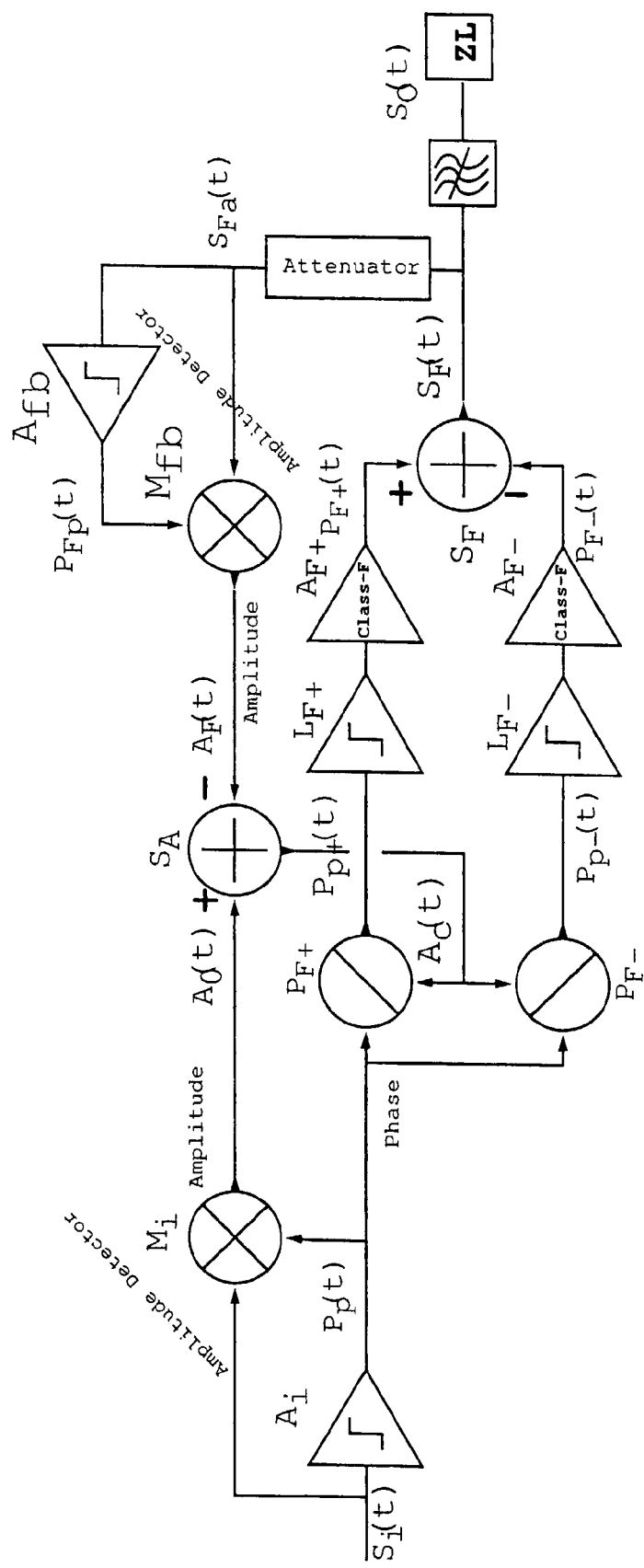
Fig 6  Architecture of Coherent Amplitude linearisation feedback

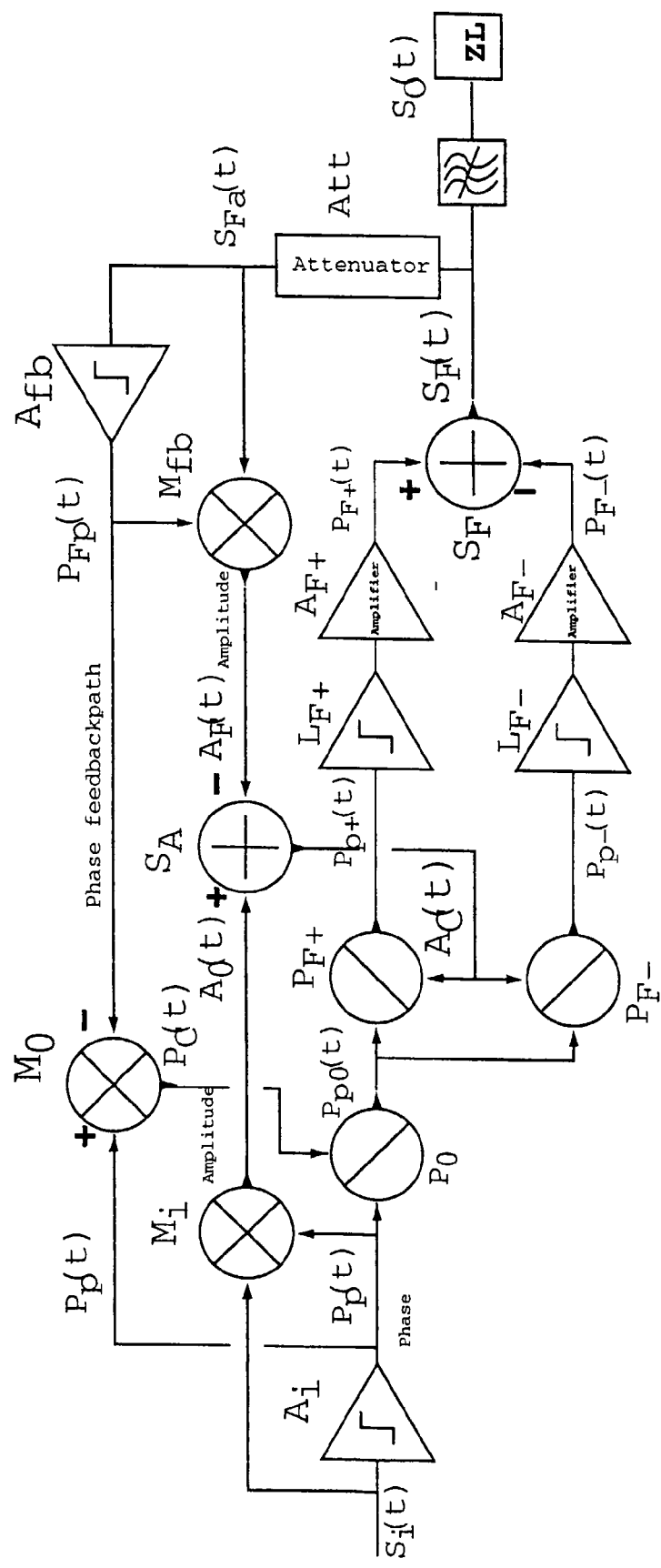
Fig. 7a  Architecture of Coherent Amplitude and Phase linearisation feedback

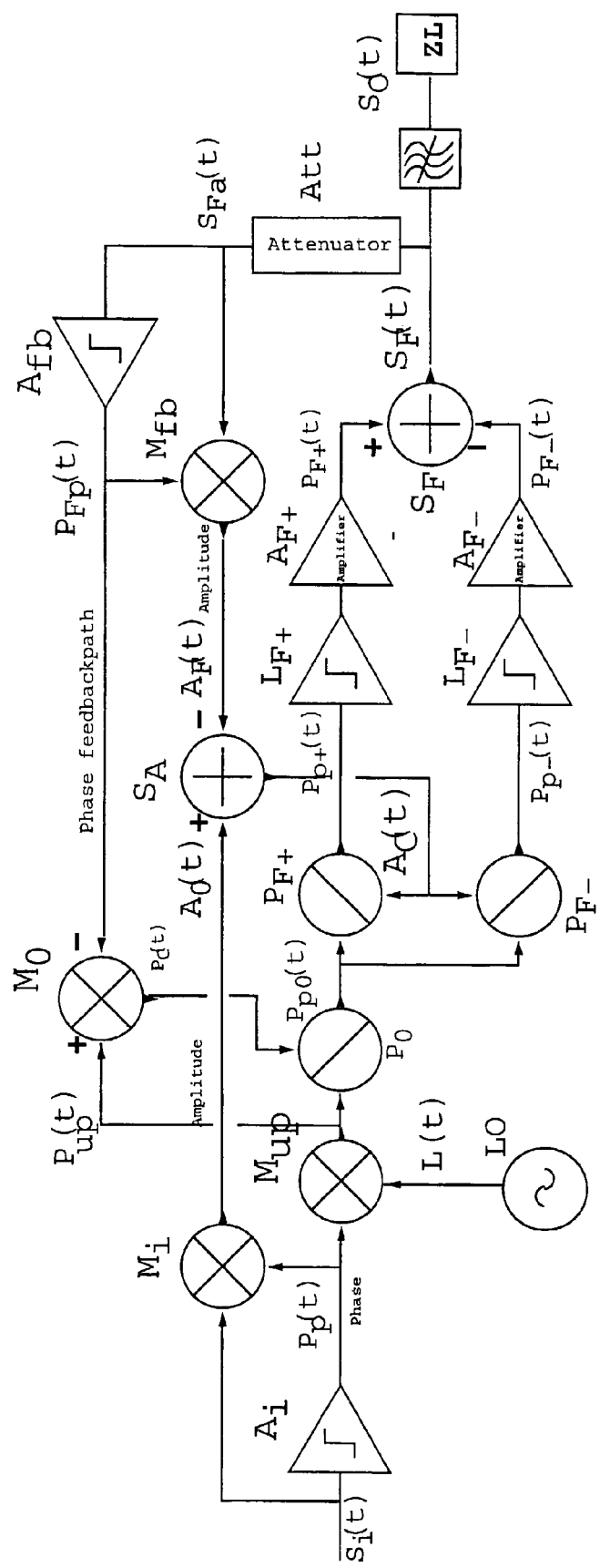
Fig. 7b  Architecture of Heterodyne Coherent Amplitude and Phase linearisation feedback

POWER AMPLIFIER AND PULSE-WIDTH MODULATED AMPLIFIER

FIELD OF THE INVENTION

The invention relates to power amplifiers. More particular the invention relates to a power amplifier having a phase amplification path. The invention also relates to a power amplifier having a magnitude amplification path and a phase amplification path. The invention further relates to a pulse-width modulated (PWM) amplifier.

DESCRIPTION OF THE PRIOR ART

The efficiency of an RF power amplifier has a significant impact on the battery life of a portable device, such as a portable transmitter, because the amplifier typically consumes the most amount of power used by the device.

For base station power amplifiers, power consumption is much larger and produces heat that reduces reliability, and may require active cooling that in turn increases the power consumption more.

Efficient power amplifiers are therefore highly desirable for power transmitters. Efficient class C, D, E and F power amplifiers are only capable of generating constant-amplitude outputs. However, many recent transmitter designs require a non-constant amplitude RF output to maximize the data rate within a given channel bandwidth.

The design of traditional linear power amplifiers normally involves a trade-off between efficiency and linearity. Polar modulation is a technique known in the art that simultaneously achieves linearity and efficiency in an RF power amplifier. Polar modulation is also known as envelope elimination and restoration (EER). In this approach, an RF input signal is decomposed into its polar components, i.e., phase and magnitude. These two polar components are amplified independently and are then recombined to generate an amplified, linear RF output signal. The phase component of the RF input signal is typically amplified by a constant-amplitude amplifier that is optimised for efficiency. The magnitude or envelope component of the RF input signal is typically amplified by a switching-mode power supply that operates as the power supply for at least the output stage of the constant-amplitude.

Various approaches to the use of polar modulation have been described by L. Kahn, "Single-Sides Transmission by Envelope Elimination and Restoration", Proc. IRE, July 1952, pp. 803-806; and by M. Koch, R. Fisher, "A High-Frequency 835 MHZ Linear Power Amplifier for Digital Cellular Telephony", 39$^{th}$ IEEE Vehicular Technology Conference, 3 May 1989.

FIG. 1 is a block diagram of a traditional RF amplifier 10 that employs the above described envelope elimination and restoration technique. In the amplifier shown in FIG. 1, an RF input signal 12 is first decomposed into it polar components. These polar components comprise phase, which is a constant-amplitude signal, and magnitude, which is a low-frequency envelope signal. The phase and magnitude components are amplified independently along separate paths 15 and 11, respectively. The phase and magnitude components are then recombined to generate the linearly amplified RF output signal 19.

The phase component is extracted from the RF input signal by the limiter 16, and is amplified by an efficient constant-amplitude amplifier that may comprise the non-linear preamplifier 17, and the efficient, non-linear output stage 18. The magnitude component, which has a bandwidth comparable with the channel bandwidth, is extracted from the RF input signal by the envelope detector 13, and is amplified by the linear baseband amplifier 14. To maximize efficiency, the linear baseband amplifier 14 is implemented using a switching-mode power supply having a class-D amplifier as its output stage.

It is known to have implementations of switching-mode power supplies using pulse-width modulation. The output of such a power supply is a square wave whose mark/space ratio represents the magnitude component of the RF input signal. However, using pulse-width modulation to amplify the magnitude component may introduce inter-modulation distortion into the RF output.

In order to reduce the inter-modulation distortion of a class D amplifier using pulse-width modulation it is known in the art to have a negative feedback path based on the filtered output signal. However, in US patent application having Publication No. 2002/0070799 A1 there is described a pulse-width modulated (PWM) digital amplifier having a PWM modulator driving a high power switch with a low pass filter for filtering the output of the power switch. Here, the digital amplifier has a feedback control loop with the feedback signal being provided directly from the output of the high power switch to the analogue input signal. The analogue input signal and the feedback signal are both fed to the inverting input of an integrator, where the non-inverted input of the integrator is grounded, whereby the feedback signal acts directly on the analogue input signal.

In U.S. Pat. No. 5,973,556 is disclosed a delta-modulated RF power supply having a magnitude amplification path and a phase amplification path. Here, a delta-modulated amplifier is used to amplify the magnitude component of the RF power amplifier that employs envelope elimination and restoration. The magnitude amplification path includes a feedback path from the RF output signal, but there is no feedback path in the phase amplification path.

In U.S. Pat. No. 5,675,288 is disclosed a circuit for linearizing a non-linear amplifier having an amplitude amplification path and a phase amplification path. The amplitude amplification path includes a feedback path from the output signal, and the phase amplification path also includes a feedback path from the output signal. The feedback path of the phase amplification path includes a phase comparator, whereby the phase of the feedback signal is compared to the phase of the input signal. There is no use of a magnitude or amplitude component of the output signal in the phase amplification path.

SUMMARY OF THE INVENTION

According to a first aspect of the present invention there is provided a power amplifier for generating a power amplified output signal from an input signal, said power amplifier comprising: a phase amplification path and a phase amplification stage within said phase amplification path; said phase amplification stage receiving a magnitude component of the power amplified output signal; said phase amplification stage being responsive to a phase component of the input signal, a magnitude component of the input signal, and the received magnitude component of the power amplified output signal for generating said power amplified output signal.

According to a second aspect of the present invention there is provided a power amplifier for generating a power amplified output signal from an input signal, said power amplifier comprising: a magnitude amplification path for a magnitude component of the input signal; a magnitude amplifier stage within said magnitude amplification path; a phase amplification path; and a phase amplification stage within said phase amplification path. Here, the phase amplification stage is receiving a magnitude component of the power amplified output signal and an amplified magnitude component of the input signal from the magnitude amplifier stage. The phase amplification stage is being responsive to a phase component of the input signal, a magnitude component of the input signal, the received magnitude component of the power amplified output signal, and the received amplified magnitude component of the input signal for generating said power amplified output signal.

It should be understood that for the first and second aspects of the invention, the magnitude component of the power amplified output signal being received by the phase amplification stage may be a magnitude component corresponding to the power amplified output signal. Thus, if the output signal of the power amplifier is filtered, the magnitude component may correspond to the non-filtered output signal or to the filtered output signal.

For the first and second aspects of the invention the power amplified signal generated by the phase amplification stage may relate substantially linearly in phase and amplitude to the input signal.

It is preferred for both the first and the second aspects of the invention that the phase amplification stage comprises a difference detector for generating an output depending on the difference between the received magnitude component of the input signal and the received magnitude component of the power amplified output signal. Here, it is preferred that the phase amplification path comprises a magnitude feedback path for coupling the power amplified output signal or a signal corresponding to the power amplified output signal to the difference detector as said magnitude component of the power amplified output signal. The magnitude feedback path of the phase amplification path may comprise an output envelope detector for detecting a magnitude component of the power amplified output signal. The magnitude feedback path of the phase amplification path may also comprise an attenuator to reduce the amplitude of the magnitude component of the power amplified output signal.

For both the first and second aspects of the invention it is preferred that the power amplifier further comprises an input envelope detector for detecting a first input magnitude component of the input signal and for coupling said first input magnitude component to the phase amplification stage. Here, the first input magnitude component may be coupled to the difference detector of the phase amplification stage as the received magnitude component of the input signal.

For both the first and second aspects of the invention it is preferred that the phase amplification stage comprises an amplitude to phase converter for converting the output of the difference detector to a phase difference signal.

It is within embodiments of both the first and second aspects of the invention that the phase amplification stage further may receive a phase component of the power amplified output signal, where said phase amplification stage further is responsive to the received phase component of the power amplified output signal for generating said power amplified output signal. Here, the phase amplification stage may comprise a mixer, multiplier or phase discriminator for generating an output signal depending on the phase component of the input signal and the received phase component of the power amplified output signal. It is preferred that the phase amplification stage comprises a phase feedback path for coupling the power amplified output signal to the phase discriminator. The phase feedback path may comprise a limiter for generating the phase component of the power amplified output signal. The phase feedback path may also comprise an attenuator for reducing the power amplified output signal. It is preferred that the phase amplification stage comprises a phase shifter for generating a first phase shifted signal by shifting the phase of the input phase component as a function of the signal being output from the phase discriminator.

It is within embodiments of both the first and second aspect of the invention that the phase amplification stage comprises a limiter for generating the phase component of the input signal.

For embodiments of the first and second aspects of the invention having a difference detector for producing a difference signal from the received magnitude components, the phase amplification stage may comprise a phase shifter for shifting the phase of the input phase component or the first phase shifted signal as a function of the signal being output from the difference detector. When the phase amplification stage comprises an amplitude to phase converter for converting the output of the difference detector to a phase difference signal, the input phase component or the first phase shifted signal may be shifted with the generated phase difference signal. The phase shifter may comprise a first phase shifter for shifting the phase of the input phase component or the first phase shifted signal as a function of the signal being output from the difference detector or with the phase difference signal being generated by the amplitude to phase converter, and the phase shifter may further comprise a second phase shifter for shifting the phase of the input phase component or the first phase shifted signal as an inverse function of the signal being output from the difference detector or with the inverse of the generated phase difference signal. Thus, the phase shift obtained by the second phase shifter should be substantially inverse or opposite to the phase shift obtained by the first phase shifter. The first and second phase shifters may be a first and a second multiplier/mixer for shifting the phase of the input phase component or the first phase shifted signal with the generated phase difference and the inverse of said phase difference signal, respectively.

For embodiments of the invention having first and second phase shifters, it is preferred that the phase amplification stage comprises a first and a second phase amplifier for amplifying the output signals of the first and second phase shifters, respectively. It is also within embodiments of the first and second aspects of the invention that the phase amplification stage comprises first and second phase limiters for limiting the output signals of the first and second phase shifters, respectively. Here, the outputs of the first and second limiters may be inputs to the first and second phase amplifiers, respectively. The first and second phase amplifiers may be class F amplifiers or class E amplifiers. When having class F amplifiers, the first and second amplifiers may be switch mode amplifiers.

The phase amplification stage may comprise an adder or a power mixer for adding or mixing the outputs of the first and second phase amplifiers in order to generate the power amplified output signal. It is also preferred that the phase amplification stage comprises a filter for filtering the output of the adder or power mixer to obtain the power amplified output signal. Here it should be noted that it is within the scope of the present invention that either the input signal or the output signal of the filter may be used for generating the magnitude component of the power amplified output signal.

For embodiments of the invention within the second aspect of the invention it is preferred that the first and second phase amplifiers are coupled to the output of the magnitude amplifier, whereby the gain of the phase amplifier is regulated or modified by said magnitude amplifier.

For embodiments of the invention within the second aspect of the invention it is preferred that the magnitude amplification path comprises an input envelope detector for detecting an input magnitude component of the input signal and for coupling said input magnitude component to the magnitude amplifier. Here, the input envelope detector for detecting the first input magnitude component may be part of the magnitude amplification path with said first input magnitude component being coupled to the magnitude amplifier.

For embodiments of the invention within the second aspect of the invention it is preferred that the magnitude amplifier stage comprises a class D amplifier. It is also preferred that the magnitude amplifier stage comprises a pulse width modulated amplifier. The magnitude amplifier stage may also comprise a low pass filter, whereby the output delivered by the magnitude amplifier stage is a low pass filtered signal.

According to an alternative embodiment of the second aspect of the invention, the phase amplification stage may comprise a non-linear amplifier for amplifying the output of the phase shifter, said non-linear amplifier being coupled to the output of the magnitude amplifier, whereby the gain of the non-linear amplifier is regulated or modified by said magnitude amplifier in order for the non-linear amplifier to generate the power amplified output signal. Here, the non-linear amplifier may comprise a third and a fourth multiplier/mixer for mixing the output of the magnitude amplifier with the output of the first and second multiplier/mixer, respectively, and further may comprise a power mixer for mixing the outputs of the third and fourth multiplier/mixer. It is preferred that the non-linear amplifier comprises a filter for filtering the output of the power mixer to obtain the power amplified output signal.

According to a third aspect of the present invention there is provided a pulse-width modulated amplifier comprising: a difference detector or amplifier for generating one or more outputs depending on the difference between an input signal and a feedback signal; a PWM modulator coupled to the difference detector for generating as an output thereof a pulse width modulated signal; a power switch circuit for amplifying the output of the PWM modulator; and a feedback path for coupling one or more outputs of the power switch circuit to the difference detector as said feedback signal.

For the third aspect of the invention it is preferred that the pulse-width modulated amplifier further comprises a low pass filtering circuit coupled to the output(s) of the power switch circuit. Here, It should be understood that the output(s) of the power switch circuit may be coupled to both the feedback path and the low pass filter.

For the third aspect of the invention it is preferred that the feedback path comprises an attenuator for reducing the amplitude of the feedback signal delivered to the difference amplifier. It is also preferred that the power switch circuit comprises a pull-up switch having a pull-up output and a pull-down switch having a pull-down output. Here, the power switch circuit may be controlled by the output of the PWM modulator so that when the power switch circuit is in the ON state, the pull-up switch is open and the pull-down switch is closed, and so that when the power switch circuit is in the OFF state, the pull-up switch is closed and the pull-down switch is open. It is preferred that the feedback path comprises an adder for adding the pull-up output and the pull-down output to generate a single feedback signal. Here, the output of the adder may be fed to the attenuator and via the attenuator to the difference amplifier.

For embodiments of the third aspect of the invention having a low pass filter it is preferred that the low pass filter comprises a first inductor with a first terminal coupled to the pull-up output and a second inductor with a first terminal coupled to the pull-down output. Here, a second terminal of the first inductor and a second terminal of the second inductor may both be coupled to the same terminal of an output capacitor for delivering an output signal of the pulse-width modulated amplifier.

According to an embodiment of the third aspect of the invention the PWM modulator may comprise a ring oscillator, said ring oscillator including an inverting amplifier and a first phase shifter and a second phase shifter, the phase shifts of said first and second phase shifters being controlled in response to the output(s) of the difference amplifier. Here, the difference amplifier may have two difference outputs with the signal difference between said two difference outputs representing the amplified difference between the input signal and the received feedback signal, and wherein the first phase shifter may be controlled in response to the first difference output and the second phase shifter may be controlled in response to the second difference output. It is preferred that a first phase output from the first phase shifter and a second phase output from the second phase shifter are combined to generate the output of the PWM modulator being received by the power switch circuit. Here, the first and second phase outputs may be multiplied together to generate the PWM modulator output. Preferably, this multiplication is performed by use of an ex-or function.

According to an embodiment of the third aspect of the invention the pulse-width modulated amplifier may further comprise one or more filters for filtering the output(s) of the difference amplifier, the filtered outputs of the difference amplifier being coupled as inputs to the PWM modulator. It is also within an embodiment of the third aspect of the invention that the power switch circuit comprises at least two MOSFET switch transistors.

It should be understood that it is within the scope of the present invention that the pulse-width modulated amplifier according to any of the embodiments of the third aspect of the invention may be used as the magnitude amplifier within the magnitude amplification path of the power amplifier of the second aspect of the invention.

Other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 6 shows a block diagram of a power amplifier according to an embodiment of the invention having a phase amplification path including a magnitude feedback path for a magnitude or amplitude component of the power amplifier output signal, FIGS. 7a and 7b are block diagrams showing embodiments of power amplifier according to the invention having a phase amplification path including feedback paths for both a phase component and a magnitude or amplitude component of the power amplifier output signal.

DETAILED DESCRIPTION OF THE INVENTION

Figure 1:
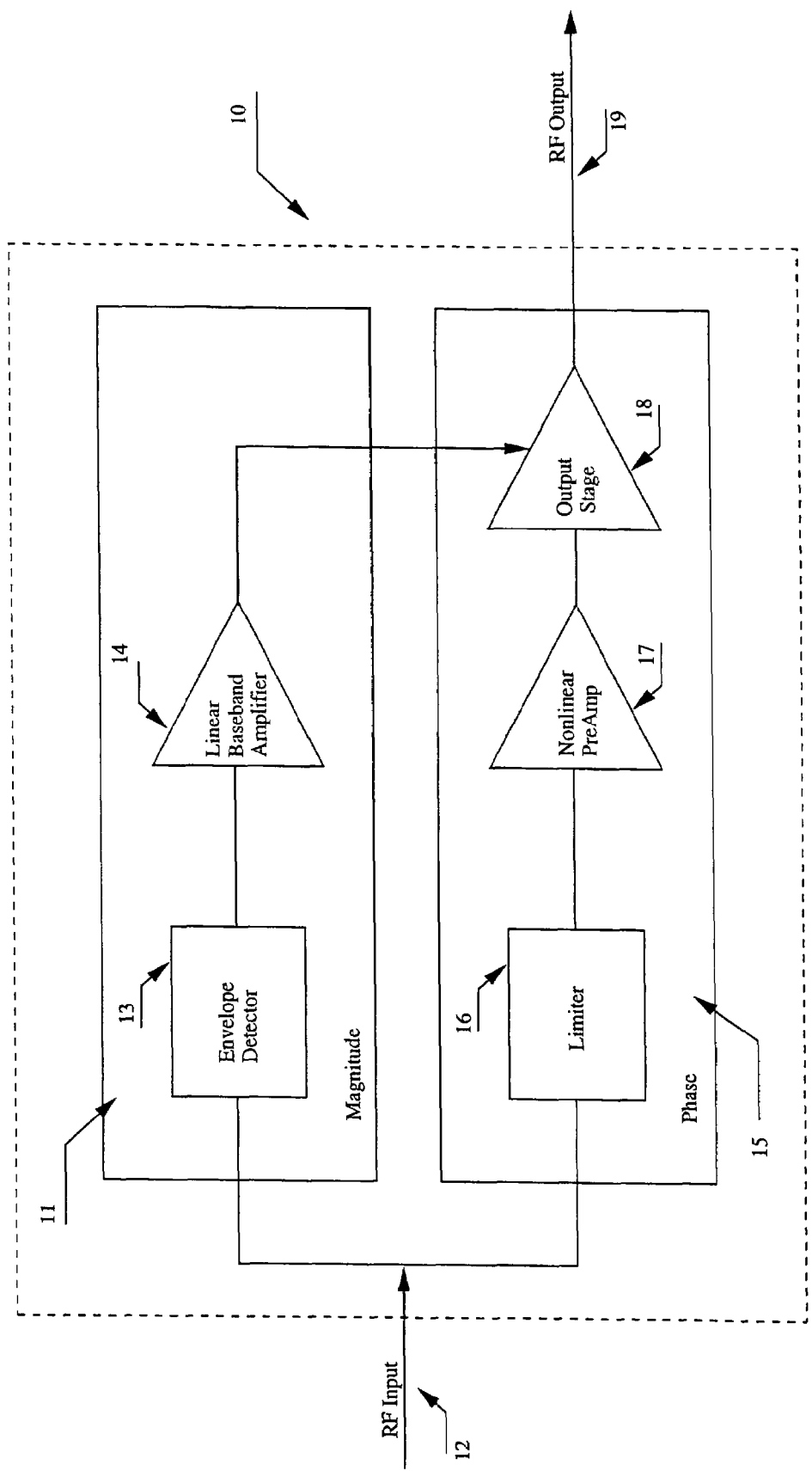
FIG. 1 shows a block schematic diagram of a conventional RF amplifier employing envelope elimination and restoration.

The second aspect of the invention provides an efficient, highly linear power amplifier, which may be used as an efficient RF power amplifier, and which is based, in part, upon the polar modulation concept discussed above in connection with FIG. 1, which shows a block schematic diagram of a conventional RF amplifier employing envelope elimination and restoration.

Figure 2:
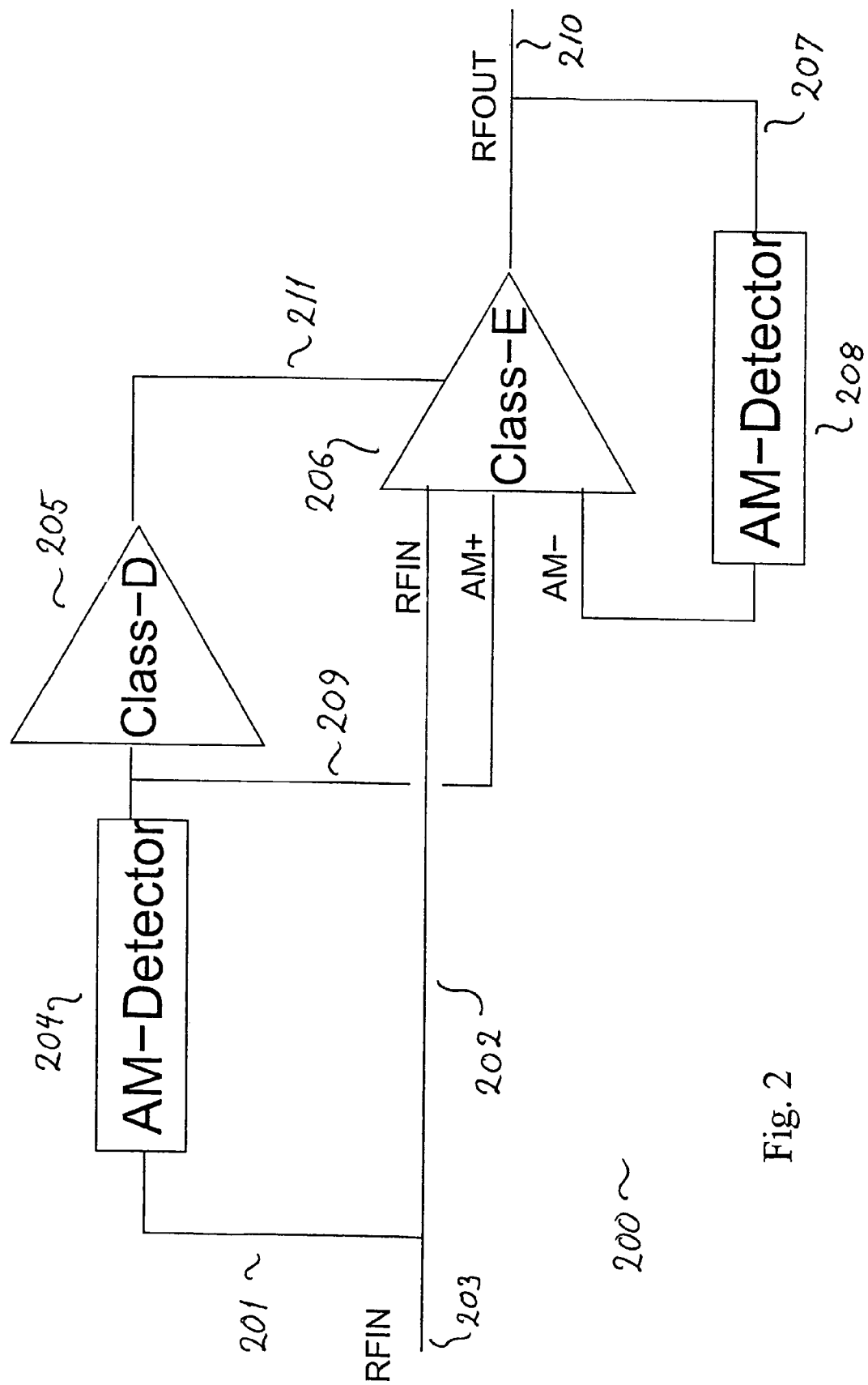
FIG. 2 shows a simplified block diagram of a power amplifier according to an embodiment of the invention having a magnitude amplification path and a phase amplification path.

A preferred embodiment of the second aspect of the invention is illustrated in FIG. 2, which shows a simplified block diagram of a power amplifier 200 having a magnitude amplification path 201 and a phase amplification path 202. The magnitude amplification path 201 includes an envelope detector 204 and a magnitude amplification stage 205, and the input signal 203 is coupled to the envelope detector 204, which extracts the magnitude component from the input signal and feeds the magnitude component to the magnitude amplification stage 205. Here, the magnitude amplification stage 205 may in a preferred embodiment include a class D amplifier.

The phase amplification path 202 includes a phase amplification stage 206 and a magnitude feedback path 207 having an envelope detector 208, which extracts a magnitude component of the power amplified output signal 210 and feeds the magnitude component of this output signal 210 to the phase amplification stage 206. The input signal 203 is fed to the phase amplification stage 206, in which the phase component of the input signal 203 is extracted. The phase amplification stage 206 further has as input the extracted magnitude component 209 of the input signal 203, which may be extracted by a separate envelope detector, but it is preferred that it is extracted by the envelope detector 204. Furthermore, the output of the magnitude amplification stage 205 is coupled to the power supply input terminal 211 of the phase amplification stage 206. The phase amplification stage 206 may include a highly efficient, non-linear phase output stage that may be a class C output stage, a class D output stage, a form of a class E output stage or a class F output stage. In a preferred embodiment the phase amplification stage 206 includes a class E amplifier.

It should be noted that according to a preferred embodiment, the input signal 203 is an RF input signal.

Figure 3:
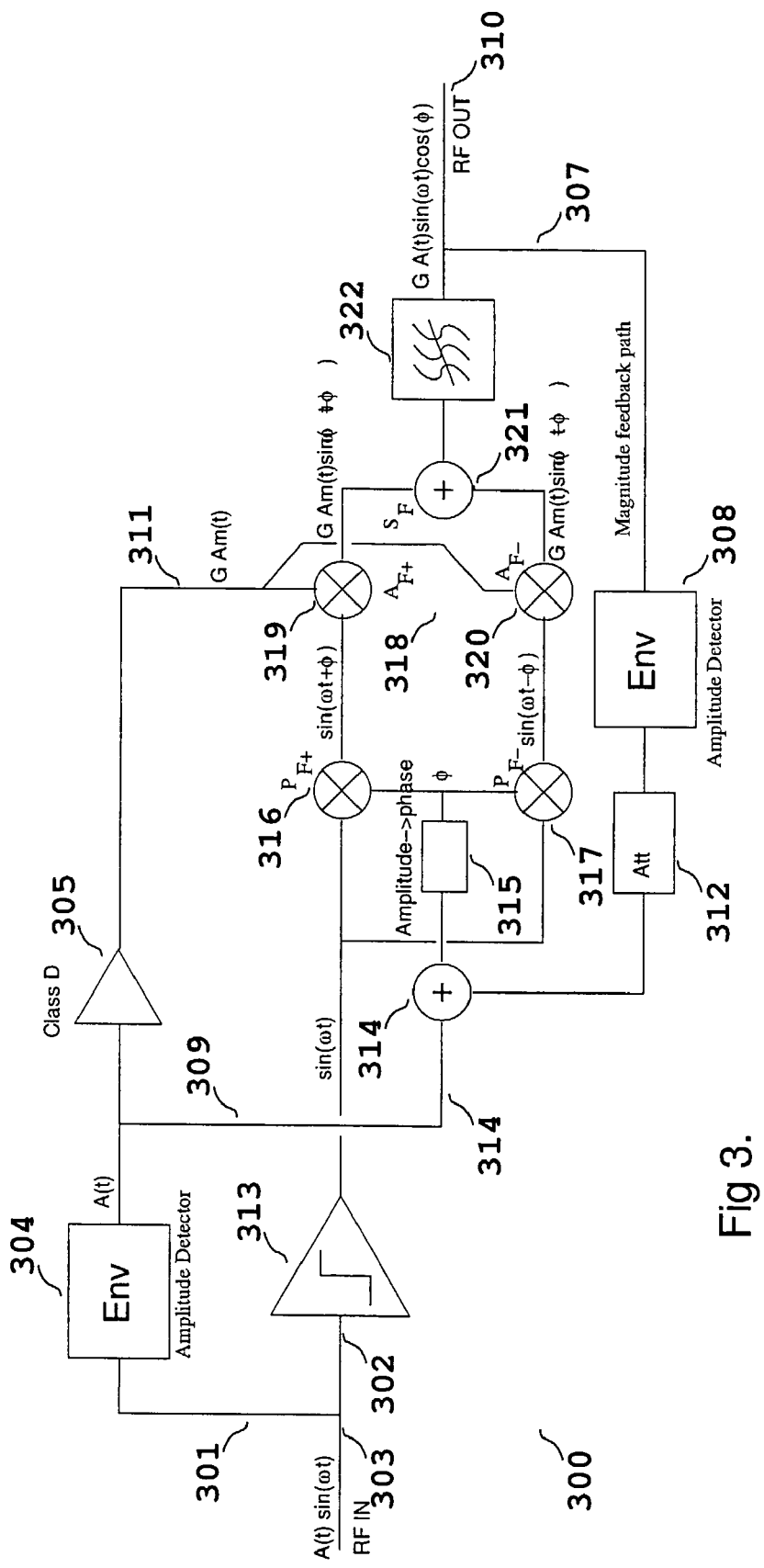
FIG. 3 shows a more detailed block diagram of an embodiment of a power amplifier according to the invention and corresponding to the diagram of FIG. 2.

FIG. 3 shows a more detailed block diagram of an embodiment of a power amplifier according to the invention corresponding to the simplified block diagram of FIG. 2. The power amplifier 300 of FIG. 3 has a magnitude amplification path 301 similar to the magnitude amplification illustrated in FIG. 2 including an envelope detector 304 and a magnitude amplification stage 305, with the input signal 303, which here is an RF signal, being coupled to the envelope detector 304, which feeds the magnitude component of the RF input signal to the magnitude amplification stage 305.

The power amplifier 300 also has a phase amplification path 302 including a phase amplification stage 306 and a magnitude feedback path 307 with an envelope detector 308, which extracts a magnitude component of the power amplified RF output signal 310. The magnitude feedback path 307 also has an attenuator 312 for reducing the amplitude of the output of the envelope detector 308. In FIG. 3 the attenuator 312 is arranged after the envelope detector 308, but the attenuator 312 may also be arranged before the envelope detector 308. The phase amplification stage 306 comprises a limiter 313 for generating the phase component of the RF input signal 303. The phase component may be extracted from the input signal 303 by removing the magnitude component by limiting, i.e. clipping, the RF input signal. The output of the limiter 313 is a constant envelope signal having a phase that changes according to the phase of the RF input signal. The phase amplification stage 306 also comprises a difference detector 314. The difference detector 314 receives as input signals the output 309 of the envelope detector 304 and the output of the attenuator 312 representing the reduced magnitude component of the RF output signal 310. The output of the difference detector 314, which represents the difference between the received magnitude component signals, is fed to an amplitude-to-phase converter 315 for converting the received magnitude difference signal to a phase signal. The phase output of the converter 315 is fed to phase shifters 316 and 317, which phase shifters 316, 317 further receives as input the produced phase component of the RF input signal 303 being output from the limiter 313. For phase shifter 316 the output signal is shifted in phase by the phase output of converter 315, while for phase shifter 317 the output signal is shifted in phase by the inverse of the phase output of converter 315.

The phase amplification stage 306 further comprises a non-linear amplifier 318 having first and second multipliers/mixers 319, 320, a power mixer 321 and a filter 322. The first multiplier 319 has as input the output from phase shifter 316, while the power input terminal of the multiplier 319 is supplied from the output of the magnitude amplification stage 305. Similar, the second multiplier 320 has as input the output from phase shifter 317, while the power input terminal of the multiplier 320 is also supplied from the output of the magnitude amplification stage 305. The outputs of the multipliers 319 and 320 are added together by the power mixer 321, while the output of the mixer 321 is filtered by the filter 322, which filter 322 delivers the power amplified RF output signal 310.

Figure 4:
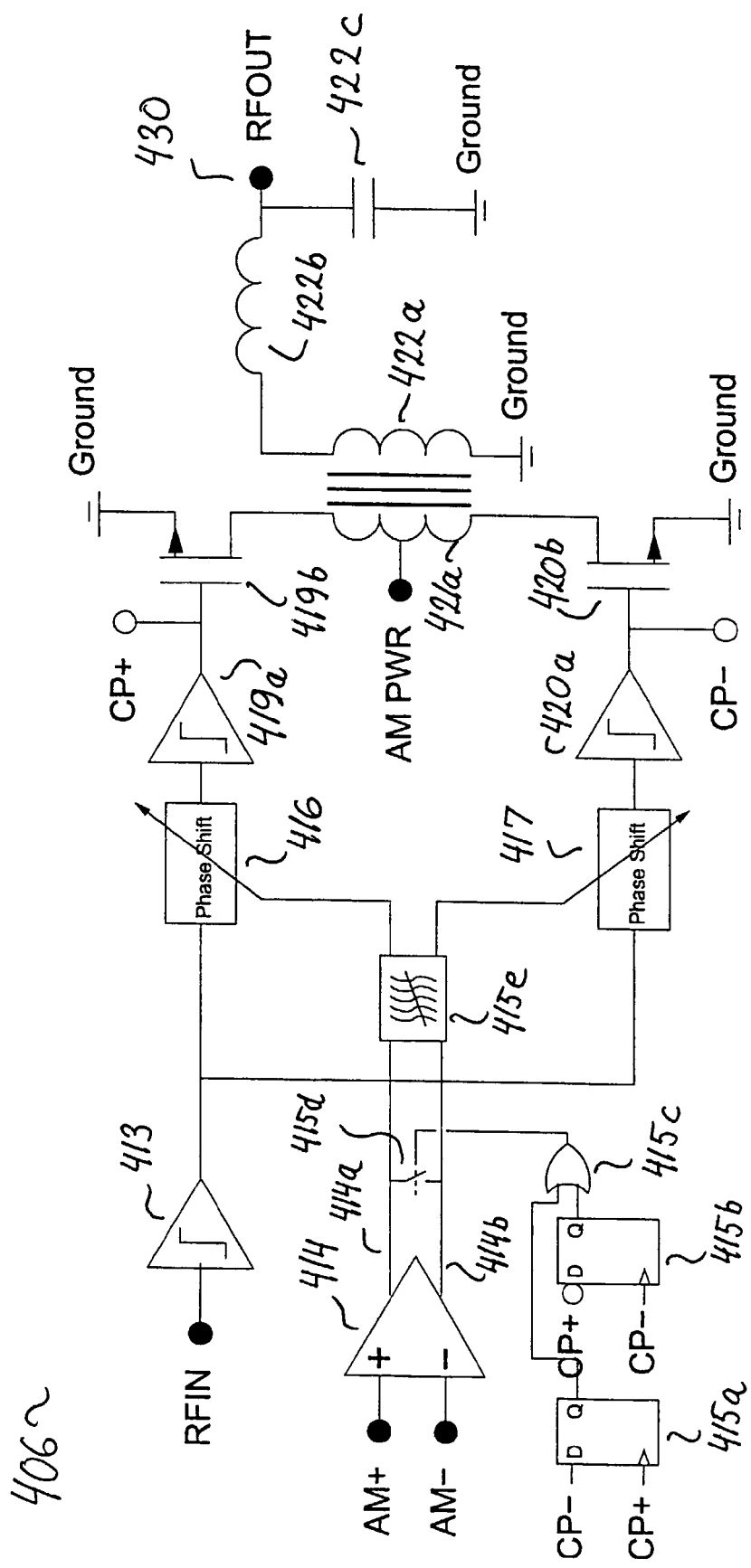
FIG. 4 shows a detailed diagram of an embodiment of a phase amplification stage according to the invention corresponding to the phase amplification path of the power amplifier illustrated in FIG. 3.

FIG. 4 shows a detailed diagram of an embodiment of a phase amplification stage 406 according to the invention corresponding to the phase amplification stage 306 of the power amplifier illustrated in FIG. 3. In FIG. 4 the RF input signal is fed to the limiter 413, with the output of the limiter being fed to the phase shifters 416 and 417. The outputs of the envelope detector 304 and the attenuator 312 are fed into the difference detector 414.

The difference detector 414 has two outputs 414a, 414b being inputs to the amplitude to phase converter corresponding to the converter 315 of FIG. 3. In FIG. 4, the converter comprises two D-type flip flops 415a, 415b, having as inputs square wave signals CP+ and CP− being square wave signals of the RF input signal. The outputs of the flip flops 415a, 415b are multiplied together by an OR-gate 415c, which in turn controls a switch 415d for switching the outputs 414a, 414b of the difference detector 414 to thereby obtain phase difference outputs corresponding to the detected amplitude difference. The switched difference detector outputs are fed into a filter 415e, and the filtered positive phase difference output is fed into the phase shifter 416, while the filtered negative phase output is fed to the phase shifter 417.

The output of the phase shifter 416 is fed into a limiter 419a being part of the multiplier 319, with the output of the limiter 419a being fed to the gate of a first N-MOS transistor 419b, which forms the power part of the multiplier 319, with the source of the transistor 419b being grounded and the drain being the power input coupled to the output of the magnitude amplification stage 305 via an inductor 421a. In the same way, the output of the phase shifter 417 is fed into a limiter 420a being part of the multiplier 320, where the output of the limiter 420a is fed to the gate of a second N-MOS transistor 420b, which again forms the power part of the multiplier 320, with the source of the transistor 420b being grounded and the drain being the power input coupled to the output of the magnitude amplification stage 305 via the inductor 421a.

The power mixer of the diagram of FIG. 4 corresponding to the power mixer 321 of FIG. 3 is obtained by having the drain parts of the N-MOS transistors 419b, 420b being coupled together by the inductor 421a, which has as input the output signal of the magnitude amplification stage 305. The inductor 421a forms part of a transformer, with the other side of the transformer having an inductor 422a, the output of which is coupled to an inductor 422b being part of the filter corresponding to the filter 322 of FIG. 3, which also includes a capacitor 422c. The filter output is the power amplified RF output signal 430.

Figure 5:
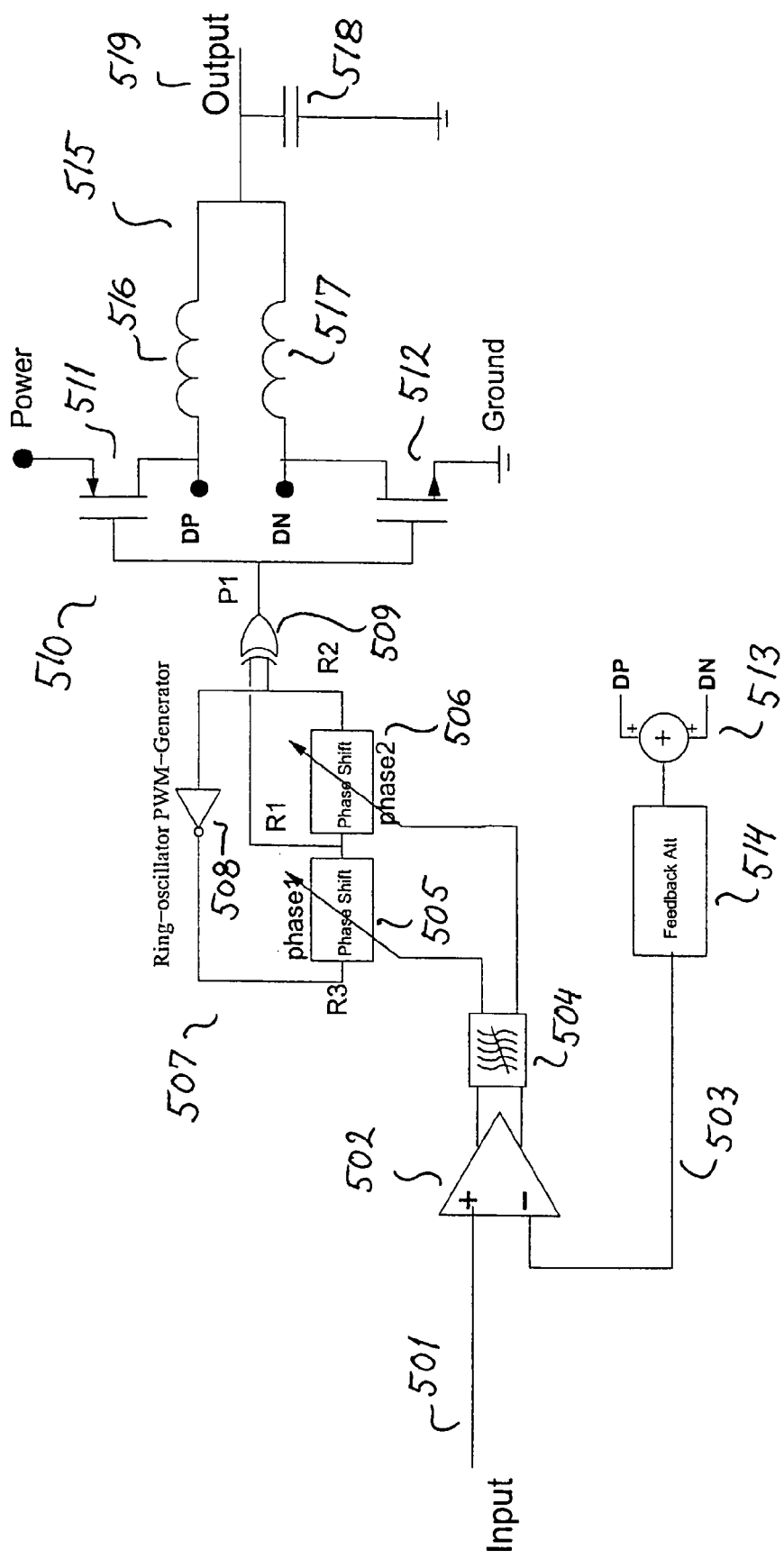
FIG. 5 shows a detailed diagram of an embodiment of a pulse-width modulated amplifier according to the invention.

According to the third aspect of the invention there is provided a pulse-width modulated amplifier, which may provide a solution for the magnitude amplification stage of the power amplifier of the second aspect of the invention discussed above. An embodiment of a pulse-width modulated amplifier according to the third aspect of the invention is illustrated in FIG. 5. In FIG. 5, the input signal 501, which may be a magnitude component of an RF input signal, is fed into a difference detector or amplifier 502, which detector 502 has a feedback signal 503 as the second input. The difference detector 502 has two outputs, which are both filtered by a low pass filtering circuit 504, and the two filtered difference outputs are used as control inputs for a first phase shifter, 505, and a second phase shifter, 506, both phase shifters being part of a PWM modulator 507.

The PWM modulator 507 or generator is a ring oscillator having the phase shifters 505 and 506 arranged in series so that the output of the first phase shifter 505 provide the input to the second phase shifter 506, with the output of the second phase shifter 506 providing the input to an inverting amplifier 508, with the output of the inverter 508 providing an input to the first phase shifter 505. Thus, the phase shifts provided by the phase shifters 505 and 506 are controlled by the outputs of the difference detector 502. The output R1 of the first phase shifter 505 and the output R2 of the second phase shifter are multiplied together by a multiplying circuit or an EX-OR function 509 to thereby generate the output P1 of the PWM modulator.

The output P1 of the PWM modulator is used as a control input for a power switch circuit 510. The power switch circuit 510 can be implemented using CMOS technology, and for the circuit in FIG. 5 the power switch 510 comprises a P-MOS Transistor 511 having the source coupled to the positive supply voltage and an N-MOS transistor 512 having the source coupled to ground. The gates of both transistors 511 and 512 are being controlled by the output P1. The drain DP of the P-MOS transistor 511 provides a first output of the power switch 510, while the drain DN of the N-MOS transistor 512 provides a second output of the power switch 510. When the P-MOS transistor 511 is in the ON state, the N-MOS transistor is OFF and the output DP is pulled up by the supply voltage, and when the N-MOS transistor 512 is in the ON state, the P-MOS transistor is OFF and the output DN is pulled down by ground. The power switch outputs DP and DN are added together by an adder circuit 513, and the output of the adder circuit is fed to attenuator 514, with the output of the attenuator providing the feedback signal 503 being delivered to the difference detector 502.

For the embodiment of the PWM modulated amplifier shown in FIG. 5, the outputs DP and DN of the power switch 510 are also coupled to a low pass filter 515 in order to obtain a filtered output 519 of the amplifier. Here, the filter 515 comprises a first inductor 516 having a first terminal coupled to the output DP, while the output DN is coupled to the first terminal of a second inductor 517. The second terminals of the inductors 516 and 517 are coupled together and to the output terminal of an output capacitor 518.

FIG. 6 shows a block diagram of a power amplifier according to the first aspect of the invention having a phase amplification path including a magnitude feedback path for a magnitude or amplitude component of the power amplifier output signal.

The architecture of the block diagram of FIG. 6 may be named coherent amplitude linearisation feedback. In FIG. 6 the input signal $S_i(t)$, which may be a RF input signal, is amplified to $A_v S_i(t)$ by use of the principle of the first aspect of the invention.

$$S_i(t) = A(t)\sin(\omega_0 t) \quad (1)$$

The phase of the input signal is extracted by limiting the signal $S_i(t)$ by use of limiter block $A_i$.

$$P_p(t) = \Pi\{S_i(t)\} \approx \Pi\{\sin(\omega_0 t)\} \quad (2)$$

In equation (2) $\Pi(x)=1$ for $x>0$, and $\Pi(x)=-1$ for all other values of x.

The phase of the signal is shifted by use of two phase shifters $P_{F+}$ and $P_{F-}$.

$$P_{p+}(t) \approx \Pi\{\sin(\omega_0 t + \phi_C)\}$$

$$P_{p-}(t) \approx \Pi\{\sin(\omega_0 t - \phi_C)\} \quad (3)$$

In equation (3) $\phi_C = \phi_K A_C(t)$.

The signals $P_{p+}$ and $P_{p-}$ are fed to amplifier blocks $A_{F+}$ and $A_{F-}$ via limiting blocks $L_{F+}$ and $L_{F-}$ respectively, and the amplified signals $P_{F+}$ and $P_{F-}$ are summed together or added together in an adder block $S_F$ to produce a signal $S_F(t)$. The signal $S_F(t)$ is fed through a filter to produce an output signal $S_O(t)$. The signal $S_O(t)$ may be given by the fundamental harmonic of $S_F(t)$, and may be written as:

$$S_O(t) = S_{F(harmonic1)}(t) = P_{F+(harmonic1)}(t) + P_{F-(harmonic1)}(t) \quad (4)$$

$$S_O(t) = G(\sin(\omega_0 t + \phi_C) + \sin(\omega_0 t - \phi_C))$$

$$= 2G(\cos(\phi_C) \times \sin(\omega_0 t))$$

$$= 2G(\cos(\phi_K \times A_C(t)) \times \sin(\omega_0 t))$$

From equation (4) it may be seen that the amplitude of the output signal $S_O(t)$ can be controlled via the signal $A_C(t)$. The $A_C(t)$ signal is the output of a difference detector, which has as inputs a magnitude component $A_0(t)$ of the input signal $S_i(t)$ and a magnitude component $A_F(t)$ of the output signal. The magnitude component $A_0(t)$ of the input signal $S_i(t)$ can be generated by the mixer block $M_i$ and the magnitude component $A_F(t)$ of the output signal can be generated by use of mixer block $M_{fb}$, limiter $A_{fb}$ and an Attenuator block. The feedback input to the Attenuator block may be the non-filtered output signal $S_F(t)$ or the filtered output signal $S_O(t)$. For the diagram of FIG. 6, the magnitude feedback path includes the attenuator block, the limiter $A_{fb}$ and the mixer block $M_{fb}$, thereby providing a feedback path from the non-filtered output signal $S_F(t)$ to the difference detector providing the signal $A_C(t)$ to the phase shifters $P_{F+}$ and $P_{F-}$. For the diagram of FIG. 6, the limiter $A_{fb}$ and the mixer block $M_{fb}$ may be looked upon as performing an envelope detector function.

If the phase shifts of signals $P_{p+}$ and $P_{p-}$ are not exact opposite, the magnitude feedback path delivering the magnitude component of the output signal to the difference detector may cause a chirp (phase-error) on the output. This can be corrected by adding a phase feedback. This is illustrated in FIG. 7a, which shows a block diagram of a power amplifier according to the invention having a phase amplification path including feedback paths for both a phase component and a magnitude or amplitude component of the power amplifier output signal.

In FIG. 7a, the magnitude feedback path is the same as in FIG. 6, but a phase feedback path is provided sharing the Attenuator block and the limiter $A_{fb}$ with the magnitude feedback path, with the output of the phase feedback path being the output signal $P_{Fp}$ from the limiter $A_{fb}$, where the signal $P_{Fp}$ represents the extracted phase signal of the non-filtered output signal $S_F(t)$, and where $P_{Fp}$ is fed to mixer block or Phase discriminator block $M_0$, which further has as input the output signal $P_p$ from the limiter $A_i$, where $P_p$ represents the extracted phase signal of the input signal $S_i$. The output of the Phase discriminator block $M_0$ is fed to Phase shifter block $P_0$, which further has as input the output signal $P_p$ from the limiter $A_i$. The Phase shifted output signal of Phase shifter block $P_0$ is used as input signal for the phase shifters $P_{F+}$ and $P_{F-}$.

The architecture of the block diagram of FIG. 7a may be named coherent amplitude and phase linearisation feedback.

By using a circuit corresponding to the diagram of FIG. 6 or FIG. 7a, an amplitude or magnitude amplifier being part of a magnitude amplification part may be omitted.

The architecture in FIG. 7a can be turned in to a heterodyne up converter by inserting a mixer block $M_{up}$ in front of $P_0$. The heterodyne system is show in FIG. 7b. The input signal $P_p(t)$ to the mixer $M_{up}$ is up converted to signal $P_{up}(t)$, which is then input to the phase shifter $P_0$, via a local oscillator input signal $L(t)$, with the $L(t)$ signal being generated in a local oscillator block LO. It is noted that the in FIG. 7b it is the up converted output signal $P_{up}(t)$, which is now fed to the Phase discriminator block $M_0$, instead of the signal $P_p(t)$, which is used in FIG. 7a.

It should be understood that for the block diagrams of FIGS. 6, 7a and 7b, the blocks named M ($M_i$, $M_0$, $M_{fb}$, $M_{up}$) are multipliers multiplying the two input signals. An M block may also be called a mixer. The blocks named P ($P_p$, $P_{F+}$, $P_{F-}$) are phase shifters. The output signal of a P block is phase shifted from a first input signal. The second input signal of a P block controls the value of the phase shift on the output. The blocks named S ($S_F$, $S_A$) are adder or subtracting blocks. The output signal of an S block is given by the sum or difference of the input signals.

In the block diagrams of FIGS. 6, 7a and 7b, the amplifiers $A_{F+}$ and $A_{F-}$, which are controlled by signals $P_{p+}$ and $P_{p-}$ are delivering the output signals $P_{F+}$ and $P_{F-}$ to the summing or adder unit $S_F$, which delivers the signal $S_F(t)$ to the output filter. The output filter in turn delivers it's signal to the load, $Z_L$. The signals from limiter blocks $L_{F+}$ and $L_{F-}$ control the amplifiers $A_{F+}$ and $A_{F-}$, which may be class F amplifiers.

Figure 8:
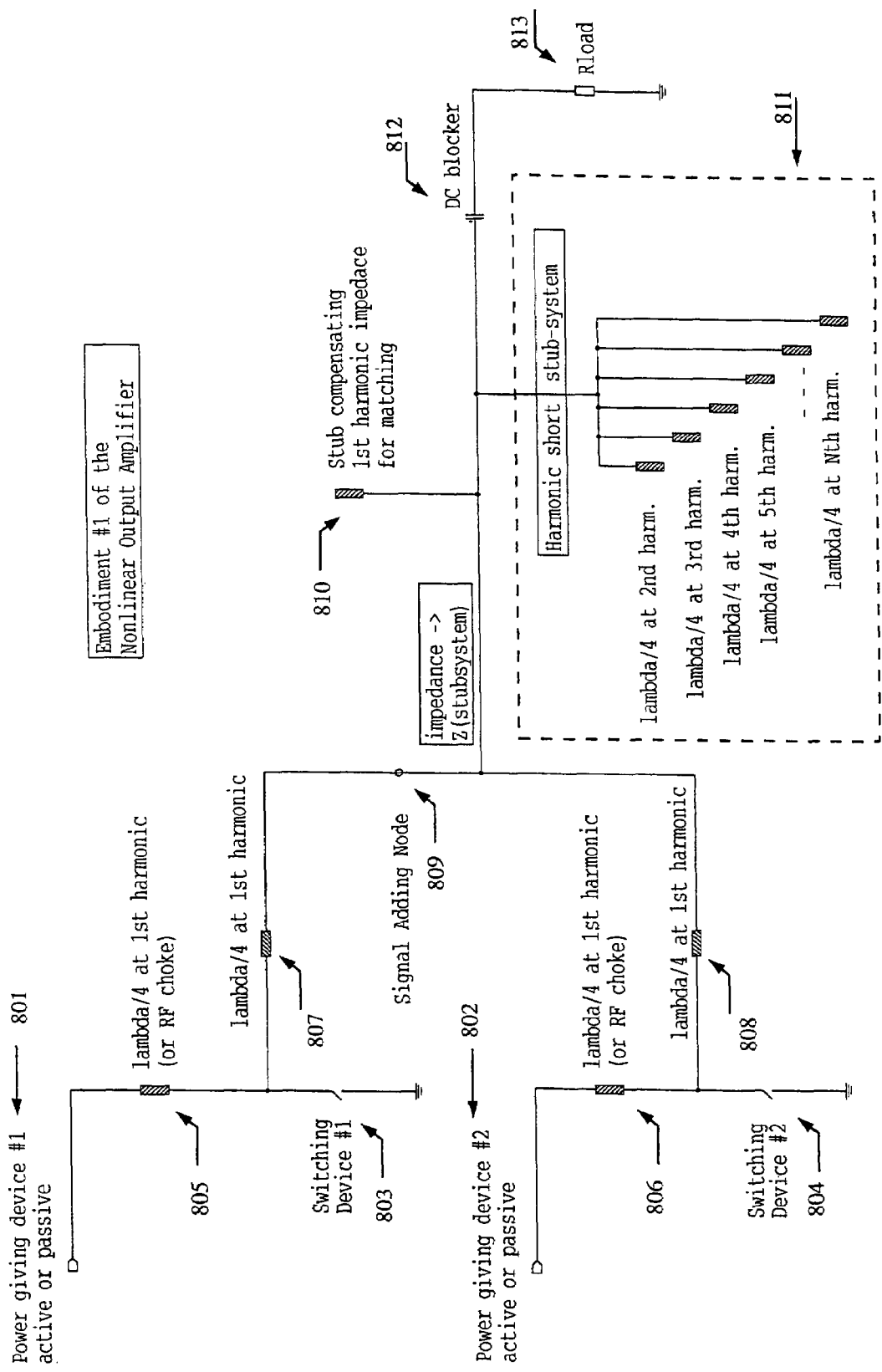
FIG. 8 shows a first embodiment of a phase amplifying stage with an adder output, which may be used in connection with the power amplifiers of FIGS. 6, 7a and 7b.
Figure 9:
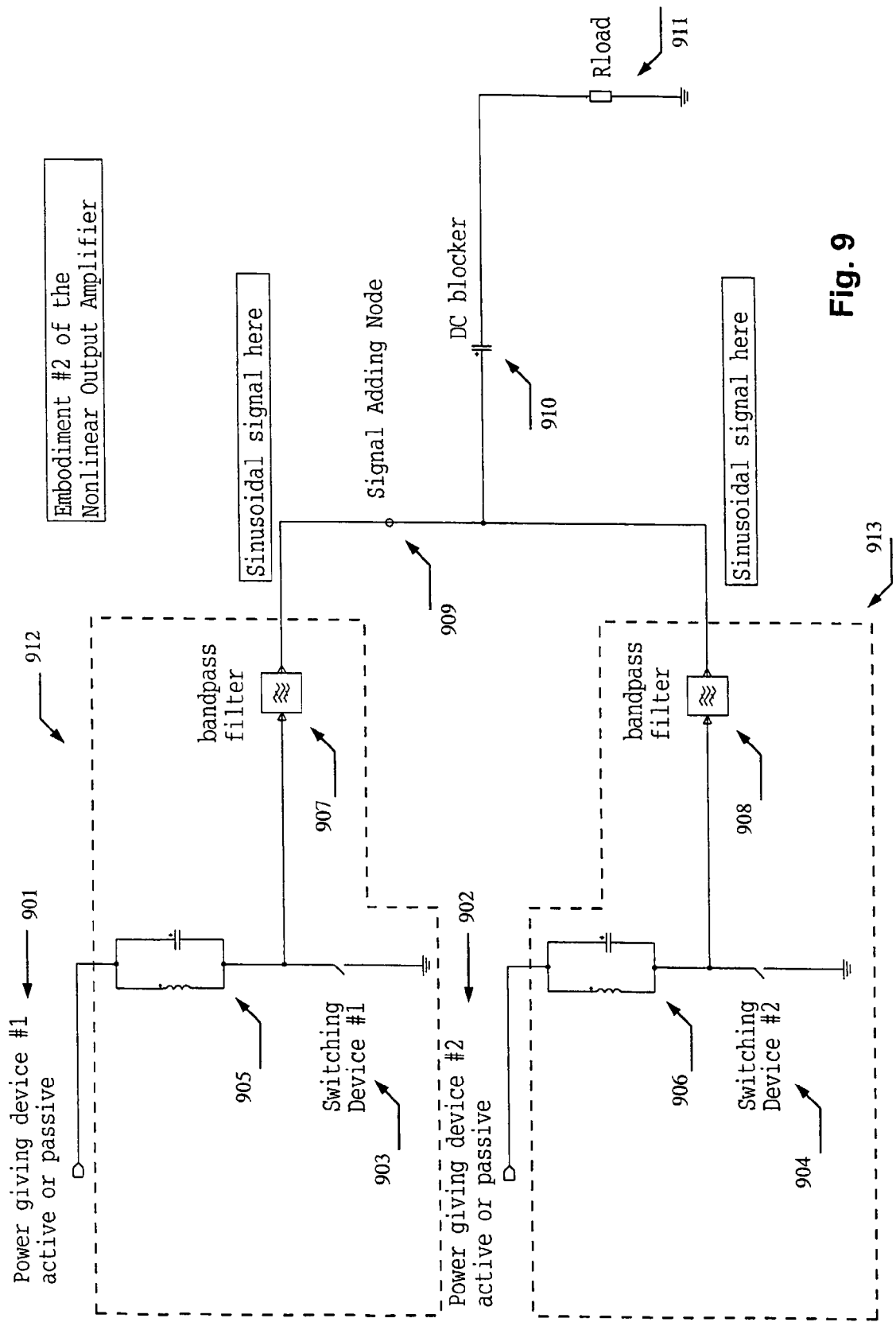
FIG. 9 shows a second embodiment of a phase amplifying stage with an adder output, which may be used in connection with the power amplifiers of FIGS. 6, 7a and 7b.

In FIGS. 8 and 9 are shown two embodiments of a phase amplifying stage with an adder output, which may be used to provide the functions of the amplifiers $A_{F+}$ and $A_{F-}$ and the adder $S_F$ in the diagrams of FIGS. 6, 7a and 7b. As may be seen from the description of FIGS. 8 and 9 given below, the signals from the limiter blocks $L_{F+}$ and $L_{F-}$ may be controlling two switching devices, having the property of switching between of two states; open and closed. The phase amplifying stages of FIGS. 8 and 9 are based on high-efficiency amplifying structures. These structures may achieve high efficiency because they only deliver a fixed power output level.

For the first embodiment of the phase amplifying stage with an adder illustrated in FIG. 8, it is preferred that the output signal addition and cancelling is performed on sinusoidal signals, e.g.

$$S(\text{out}) = S1 + S2 = \text{Const} * [\sin(\omega t + \phi_C) + \sin(\omega t - \phi_C)] \tag{5}$$

where S(out) is the output signal, and S1 and S2 are the signals delivered from each class F amplifier.

It can be shown that the two sine waves of equation (5) may add to form a sine wave with an amplitude related to the phase $\phi_C$. The embodiment shown in FIG. 8 is a solution based on a class F amplifier. The class F amplifier, known for many years in the art, operates by demanding a matched or at least real impedance presented at the carrier frequency $f_c$, also called the $1^{st}$ harmonic (of the carrier frequency). Even harmonics, eg. $2 \cdot f_c$, $4 \cdot f_c$, $6 \cdot f_c$, and so forth, must be presented to a low impedance or an impedance substantially close to a shortcut, while odd harmonics, eg. $3 \cdot f_c$, $5 \cdot f_c$, $7 \cdot f_c$, and so forth, must be presented with a high impedance, or an impedance substantially close to an open-circuit. If these requirements are met, a standard class F amplifier will deliver sinusoidal output voltage.

The system of FIG. 8 comprises a stub system know as the 'harmonic short stub system'. Each quarter wave of the 'harmonic stub system' presents a short or a substantially low impedance seen from the schematic node 'signal adding node'. At the $1^{st}$ harmonic (the carrier frequency) the 'signal adding node' viewed in the direction denoted on FIG. 8 as Z(stubsystem) the load presents a complex impedance R+jX which has a positive R, and an X between $-\infty$ and $+\infty$, preferably X=0.

Those skilled in the art will recognize that each switching device will be presented to a short at even harmonics, eg. $2 \cdot f_c$, $4 \cdot f_c$, $6 \cdot f_c$ and so forth, while odd harmonics, eg. $3 \cdot f_c$, $5 \cdot f_c$, $7 \cdot f_c$ and so forth will appear as open loads (high impedances), when seen from each switching device. When using a lambda/4 length transmission line instead of the RF Chokes, see 805 and 806 on FIG. 8, the even harmonics will be shorted through these strips, provided that the power giving device has a substantially low impedance at the frequencies in question. In that case, the even harmonic strip lines in the 'harmonic short stub-system' can be spared. Having all harmonics above $f_c$ shorted at the node 'Signal Adding Node', means that the impedance at these harmonics as seen from one switching device is unaffected of the behavior of the other switching device, as well as the value of R(load). The first harmonic sinusoidal signals are added at the first harmonic as the formula above suggests, producing a sinusoidal signal with an amplitude given by the phase $\phi_C$.

In FIG. 8 the devices referred to by numerals 801 and 802 are power supplies. They may be constant, e.g. giving a fixed voltage, or varying. They may be coupled in an open-loop arrangement, or may be in a closed-loop (feedback) arrangement where their varying voltage may depend on the output power. In an arrangement where their voltage varies, variations may be slow to accommodate adjustments in power levels, and fast, to create amplitude modulation on the output signal. In the latter case, the voltage level may, or may not, depend on the resulting output voltage as given by the phase amplifier.

The devices referred to by numerals 803 and 804 are switching devices capable of fast switching between two states, one where the device is short circuited, and another where the device is open, e.g. not conducting. These devices can be MOSFET transistors, or bipolar, LDMOS/VDMOS, HBT, GaAs, radio-tubes, or other switching devices of any kind able to shift substantially fast between substantially short and open impedances. They are switched between on- and off-state by controlling signals coming from the limiter blocks $L_{F+}$ and $L_{F-}$, see FIGS. 6, 7a or 7b.

The devices referred to by numerals 805 and 806 can be an RF blocking device, for example a choke coil, but also a transmission line having a length of one quarter of the wavelength as found at the frequency to transmit. As known in the art, transmission lines are lines of conducting material having lengths in the vicinity of the wavelength of the frequency in which to utilise the transmission line. The wavelength of the signal in the transmission line material is denoted 'lambda'.

A transmission line having a length of lambda/4 at some frequency, will in a condition where the end is non-loaded (open circuited) be substantially short-circuited viewed from the other end of the transmission line. Likewise, a short-circuit in one end will be viewed as a substantially open-circuited load when viewed from the other end. As the wavelength and frequency are related like:

$$\text{lambda(freq)=Const/freq} \tag{6}$$

the second harmonic will have a wavelength half the size of the first harmonic, the third harmonic will have a wavelength of one third of the first harmonic, and so forth. Thus, a transmission line has varying length when seen at different frequencies.

Returning to transmission lines 805 and 806, if we in this embodiment short-circuit the power giving devices 801 and 802 at all frequencies N*f(transmit), where N is a positive integer, the short circuit at the power giving device will due to the nature of transmission lines be seen as an open at the first harmonic, where the transmission line length l(trans)= lambda/4, a short circuit at the second harmonic, where l(trans)=2*lambda/4, an open at the third harmonic, where l(trans)=3*lambda/4, and so forth.

A collection of transmission lines 811 may be individually adjusted as to represent a substantially short-circuit at frequencies 2*f(transmit), 3*f(transmit), 4*f(transmit), 5*f (transmit) and so forth. It is left to the implementation to select how many transmission lines to add to 811, but when reaching a certain frequency, N*f(transmit), adding extra transmission lines tuned to higher frequencies does not pay off.

Transmission line 810 is in this embodiment preferred to have a length so as to make the impedance at the $1^{st}$ harmonic, as seen in the direction pointed out on FIG. 8 as Z(stubsystem), appear as Z(stubsystem)=R(load)+j*0, e.g. a real impedance.

To repeat, the impedance seen as Z(stubsystem) is:

$$Z(\text{stubsystem},1^{st}\text{ harmonic})=R(\text{load})$$

$$Z(\text{stubsystem},2^{nd}\text{-}N^{th}\text{ harmonic})=0 \tag{7}$$

Transmission lines 807 and 808 converts the impedance Z(stubsystem) to an alternating short-open-short-open-... impedance sequence, and thus the switching devices 803 and 804 each individually see these impedances:

$$Z(\text{stubsystem},2^{nd})=\text{short circuit}$$

$$Z(\text{stubsystem},3^{rd})=\text{open circuit}$$

$$Z(\text{stubsystem},4^{th})=\text{short circuit}$$

$$Z(\text{stubsystem},5^{th})=\text{open circuit} \tag{8}$$

continuing this alternation towards the Nth harmonic.

To sufficiently fulfilling these impedance requirements is what embodies a class F amplifier. If transmission lines 805 and 806 are indeed transmission lines and not RF chokes, the transmission line system 811 does not need the even-numbered transmission lines, 2, 4, 6 and so forth, since 805 and 806 already short circuit even harmonic impedances.

At the node called 'signal adding node', 809, the first harmonics delivered from each switching device, are added. Because Z(stubsystem) is short circuited at all harmonics above the first, the switching devices 803 and 804 cannot affect each others operation at these frequencies. At the first harmonic frequency, the switching device 803 will see an impedance composed of 813, R(load), and switching device 804. Device 804 sees an impedance composed of 813 and 803. At the node 'signal adding node', the sine wave signals from each branch are added together.

To avoid DC power flowing from power giving devices 801 and 802 to the load 813, a DC blocking capacitor 812 is included between amplifier and load. The load 813 can be of arbitrary size, and ab smaller resistance will result in a larger delivered power.

Summarizing the circuit of FIG. 8, the switching devices 803 and 804 produce sine waves adding at node 809, the 'signal adding node'. The resulting signal is a sine wave having an amplitude adjustable by varying the phase difference between the switching signals controlling devices 803 and 804. The load, 813, benefits from the signal.

For the second embodiment of the phase amplifying stage with an adder illustrated in FIG. 9, the sinusoidal waves to be added are generated from class E amplifiers. It is preferred that the amplifier is tuned to maximum efficiency.

As the sinusoidal output signal of the two class E amplifiers 912 and 913 are added by joining their outputs by a method illustrated by the formula given by equation (5):

$$S(\text{out})=S1+S2=\text{Const}^*[\sin(\omega t+\phi_C)+\sin(\omega t-\phi_C)]$$

where S(out) is the output signal, and S1 and S2 are the signals delivered from each class E amplifier.

As already discussed it can be easily shown that the two sine waves add to form a sine wave with an amplitude related to the phase $\phi_C$.

For the circuit of FIG. 9, the basic class E amplifier is comprised of a resonator 905, 906 connected to a switching device 903, 904. The switching devices 903 and 904 are devices capable of fast switching between two states, one where the device is short circuited, and another where the device is open, e.g. not conducting. These devices can be MOSFET transistors, or bipolar, LDMOS/VDMOS, HBT, GaAs, radio-tubes, or other switching devices of any kind able to shift substantially fast between substantially short and open impedances. They are switched between on- and off-state by controlling signals coming from the limiter blocks $L_{F+}$ and $L_{F-}$, see FIGS. 6, 7a or 7b.

The resonator system should preferably be tuned to resonate in the vicinity of the carrier frequency f(carrier) of the signal to be transmitted. As the resonator represents an infinite impedance at this frequency, the switching device 903 when switched at this frequency, will create a large sinusoidal-like voltage swing across the resonator 905. The same will happen for the switching device 904 and the associated resonator 906.

The power giving devices 901 and 902 are essentially power supplies. They may be constant, e.g. giving a fixed voltage, or varying. They may be coupled in an open-loop arrangement, or may be in a closed-loop (feedback) arrangement where their varying voltage depends on the output power. In an arrangement where their voltage varies, variations may be slow to accommodate adjustments in power levels, and fast, to create amplitude modulation on the output signal. In the latter case, the voltage level may, or may not, depend on the resulting output voltage as given by the phase amplifier. It is preferred that these power giving devices present a substantially low impedance at frequencies around and above f(carrier).

Band-pass filters 907 and 908 have the primary function of removing any signal but the modulated carrier frequency f(carrier). In the art, optimizing real-world, non-ideal class E amplifiers may require additional tuning; design principles may revolve around such concepts as 'zero voltage switching', ZVS and 'zero current switching', ZCS. Resonator, switching device and band-pass filters may or may not be tuned to achieve such goals.

The sinusoidal waves produced from each class E amplifier 912 and 913 are joined in node 909, the 'signal adding node'. A DC blocking component 910 follows to avoid DC current flowing from the power giving devices 901 and 902 into the load 911.

The load-resistor 911 can be of arbitrary size, and a smaller resistance will result in a larger delivered power.

While the invention has been particularly shown and described with reference to particular embodiments, it will be understood by those skilled in the art that various changes in form and details may be made therein without departing from the spirit and scope of the invention, and it is intended that such changes come within the scope of the following claims.

The invention claimed is:

1. A power amplifier for generating a power amplified output signal from an input signal, said power amplifier comprising:
   a phase amplification path, and
   a phase amplification stage within said phase amplification path,
wherein the phase amplification stage receives a magnitude component of the power amplified output signal, and the phase amplification stage is responsive to a phase component of the input signal, a magnitude component of the input signal, and the received magnitude component of the power amplified output signal for generating said power amplified output signal, and
wherein the phase amplification stage comprises
   a difference detector for generating an output depending on the difference between the received magnitude component of the input signal and the received magnitude component of the power amplified output signal,
   an amplitude to phase converter for converting the output of the difference detector to a phase difference signal, and
   a phase shifter with a first phase shifter for shifting the phase of a first phase signal, which first phase signal is a function of the phase component of the input signal, with the phase difference generated by the amplitude to phase converter, and a second phase shifter for shifting the phase of the first phase signal with the inverse of the phase difference generated by the amplitude to phase converter.

2. A power amplifier for generating a power amplified output signal from an input signal, said power amplifier comprising:
   a phase amplification path, and
   a phase amplification stage within said phase amplification path,
wherein the phase amplification stage receives a magnitude component and a phase component of the power amplified output signal, and the phase amplification stage is responsive to a phase component of the input signal, a magnitude component of the input signal, and the received magnitude and phase components of the power amplified output signal for generating said power amplified output signal, and
wherein the phase amplification stage comprises
   a phase discriminator for generating an output signal depending on the phase component of the input signal and the received phase component of the power amplified output signal,
   a phase shifter for generating a fast phase shifted signal by shifting the phase of the input phase component as a function of the signal being output from the phase discriminator,
   a difference detector for generating an output depending on the difference between the received magnitude component of the input signal and the received magnitude component of the power amplified output signal,
   an amplitude to phase converter for converting the output of the difference detector to a phase difference signal, and
   a phase shifter with a first phase shifter for shifting the phase of the first phase shifted signal with the phase difference generated by the amplitude to phase converter, and a second phase shifter for shifting the phase of the first phase shifted signal with the inverse of the phase difference generated by the amplitude to phase converter.

3. A power amplifier according to claim 2, wherein the phase amplification stage further comprises an up converting mixer and a local oscillator producing an oscillator output signal, said up converting mixer having the input phase component and the oscillator output as inputs and producing an up converted phase signal, which up converted phase signal is replacing the input phase component as input to said phase discriminator and said phase shifter for generating the first phase shifted signal.

4. A power amplifier according to claim 2, wherein the phase amplification stage comprises a phase feedback path for coupling the power amplified output signal to the phase discriminator as said phase component of the power amplified output signal.

5. A power amplifier according to claim 4, wherein the phase feedback path comprises a limiter for generating the phase component of the power amplified output signal.

6. A power amplifier according to claim 4, wherein the phase feedback path comprises an attenuator for reducing the power amplified output signal.

7. A power amplifier according to claim 1, said power amplifier further comprising:
   a magnitude amplification path for a magnitude component of the input signal, and
   a magnitude amplifier stage within said magnitude amplification path,
wherein the phase amplification stage further receives an amplified magnitude component of the input signal from the magnitude amplifier stage, and the phase amplification stage further is responsive to the received amplified magnitude component of the input signal for generating said power amplified output signal.

8. A power amplifier according to claim 1, wherein the power amplified signal generated by the phase amplification stage relates substantially linearly in phase and amplitude to the input signal.

9. A power amplifier according to claim 1, wherein the phase amplification path comprises a magnitude feedback path for coupling the power amplified output signal to the difference detector as said magnitude component of the power amplified output signal.

10. A power amplifier according to claim 9, wherein the magnitude feedback path of the phase amplification path comprises an output envelope detector for detecting a magnitude component of the power amplified output signal.

11. A power amplifier according to claim 9, wherein the magnitude feedback path of the phase amplification path comprises an attenuator to reduce the amplitude of the magnitude component of the power amplified output signal.

12. A power amplifier according to claims 1, further comprising an input envelope detector for detecting a first input magnitude component of the input signal and for coupling said first input magnitude component to the phase amplification stage.

13. A power amplifier according to claim 12, wherein the first input magnitude component is coupled to the difference detector of the phase amplification stage as the received magnitude component of the input signal.

14. A power amplifier according to claim 1, wherein the phase amplification stage comprises a limiter for generating the phase component of the input signal.

15. A power amplifier according to claim 1, wherein the phase shifter having the first and second phase shifters further comprises a first and a second multiplier/mixer for shifting the phase of the input phase component or the first phase shifted signal with the generated phase difference and the inverse of said phase difference signal, respectively.

16. A power amplifier according to claim 7, wherein the phase amplification stage comprises a first and a second phase amplifier for amplifying the output signals of the first and second phase shifters, respectively.

17. A power amplifier according to claim 1, wherein the first phase signal is the phase component of the input signal.

18. A power amplifier according to claim 1, wherein:

the phase amplification stage further receives a phase component of the power amplified output signal and further is responsive to said phase component of the power amplified output signal for generating said power amplified output signal, wherein the phase amplification stage further comprises:

a phase discriminator for generating an output signal depending on the phase component of the input signal and the received phase component of the power amplified output signal, and a phase shifter for generating a first phase shifted signal by shifting the phase of the input phase component as a function of the signal being output from the phase discriminator, and wherein the first phase signal is said first phase shifted signal.

* * * * *